United States Patent [19]

Myer

[11] 3,961,316

[45] June 1, 1976

[54] MECHANICALLY ACTUATED MAGNETOCRYSTALLINE COUNTER

[75] Inventor: Jon H. Myer, Woodland Hills, Calif.

[73] Assignee: Hughes Aircraft Company, Culver City, Calif.

[22] Filed: Dec. 23, 1974

[21] Appl. No.: 535,868

[52] U.S. Cl. .................... 340/174 TF; 235/92 MT; 235/92 R
[51] Int. Cl.² ........................................ G11C 11/14
[58] Field of Search ..... 235/92 MC, 92 EL, 92 MT, 235/92 MP, 92 EA, 92 SH, 103; 340/174 TF; 324/142

[56] References Cited
UNITED STATES PATENTS

| | | | |
|---|---|---|---|
| 3,624,361 | 11/1971 | Rossi et al. ...................... | 235/92 EL |
| 3,825,910 | 7/1974 | Carr et al. ...................... | 340/174 TF |
| 3,845,282 | 10/1974 | Mattson .......................... | 235/92 EA |
| 3,895,363 | 7/1975 | Braginski et al. ............. | 340/174 TF |

*Primary Examiner*—Joseph M. Thesz
*Attorney, Agent, or Firm*—D. C. Keaveney; W. H. MacAllister

[57] ABSTRACT

There is disclosed a miniaturized mechanically actuated magnetocrystalline counter comprising a shift register formed in a known manner on a crystal platelet of uniaxially anisotropic material. The device is suitable for use in counting a series of mechanical events such as the rotation or reciprocation of a mechanical member. Particular examples include the rotation of the unit counter of a utility meter or the reciprocation inherent in the recoil of a discharged weapon. Direct actuation of the counter by the occurrence of the mechanical event is achieved by using a permanent magnet as a transducer. The magnet is mounted to be moved with respect to the platelet responsively to the mechanical event to be counted in such a fashion that it generates a cyclically moving magnetic field to propagate at least one movable magnetic domain through the serial shift register formed in the platelet forming a bit stream which digitally accumulates data representative of the series of mechanical events. Each cycle of the field motion is produced by one of said series of mechanical events and each cycle so produced produces a single bit in said stream either by generating an additional magnetic domain and propagating all prior domains foward or, if only one domain is used, by simply indexing it forward. Any suitable means to readout the accumulated count in the shift register may be used either for direct reading or for remotely controlled electronic reading. The latter technique is particularly suited for remote reading of utility meters where the counter is driven by rotation of the pointer of the units dial of the meter.

11 Claims, 10 Drawing Figures

MECHANICALLY ACTUATED MAGNETOCRYSTALLINE COUNTER

BACKGROUND OF THE INVENTION

This invention relates in general to a device for the cumulative digital counting of mechanical events. There is an extensive development of prior art in this general field. More particularly, however, this invention relates to such a device comprising a miniaturized mechanically actuated magnet or magnetocrystalline counter device suitable for particular specialized applications such as the remote reading of utility meters and the like.

Registers for digital data using magnetic domain movable along a wire have been known as illustrated by U.S. Pat. No. 3,447,144 to R. L. Snyder. This type of shift register has been adapted to the remote reading of utility meters as shown in U.S. Pat. No. 3,503,044 to T. I. Bonyhard et al. These devices, however, are electronically driven, do not directly sense mechanical motion, but require relatively complex circuitry for this purpose even to achieve minimally acceptable signal to noise ratios.

Shift registers utilizing magnetic domains movable in the two dimensional plane of a sheet rather than along a wire are illustrated, for example, in U.S. Pat. Nos. 3,540,019 and 3,540,021 both issued to A. H. Bobeck et al. These shift registers also are electronically driven for general purpose applications such as telephone switch boards. A magnetic domain computational arrangement is shown in U.S. Pat. No. 3,845,478 to W. J. Carr. In the latter device domains are propagated at velocities proportional to the product of the magnitudes of two drive control fields responsive to two input signals. This device, also, is then primarily an electronically driven analog computing circuit rather than a mechanically driven digital counting circuit.

Biasing apparatus suitable for use in one type of magnetocrystalline counter disclosed herein has been disclosed and claimed in my own previously issued U.S. Pat. No. 3,831,156 which also contained a discussion of the general properties of movable cylindrical magnetic domains for bubbles which may be formed in uniaxially anistropic magnetic media such as single crystal epitaxial garnet or monolithic orthoferrite platelets. Both my own earlier devices and those of other workers in the prior art have, however, required input data signals to be in the form of electronic pulses.

For many counting applications it is preferred to have an accumulating digital counter which can be directly driven by the occurrence of a mechanical event rather than by electronic pulses. The generation of such pulses may or may not be representative of the counted events, is subject to errors and assuredly requires standby power which is a particular disadvantage in remote or unattended counting applications.

SUMMARY OF THE INVENTION

It is an object of the present invention to provide a mechanically actuated magnetocrystalline counter for counting a series of mechanical events.

For this purpose there is provided a uniaxially anisotropic magnetocrystalline platelet having means associated therewith to form a shift register through which a movable magnetic domain bubble may be sequentially moved. There is also provided a permanent magnetic means mounted to be moved with respect to the platelet, the motion being responsive to or caused by the occurrence of a mechanical event in a series of such events to be counted. The arrangement is such that the motion of the permanent magnetic generates a cyclically moving magnetic field which is itself positioned to move at least one magnetic domain through the shift pattern formed in the platelet. This movement forms a digital bit stream which accumulates data representative of the series of mechanical events in a manner such that each cycle of the field motion results from the occurrence of one of the mechanical events and in turn each cycle produces a single bit or an increment of one in said accumulating bit stream. The device finally includes any suitable means to read out the count accumulated in the shift register.

Where the device is to be used for the remote reading of meters such as a utility meter, the permanent magnetic means is preferably driven by the pointer shaft of the units register of a standard mechanical counter. The rotation of the shaft rotates the magnetic means so that upon completion of one cycle representing a count of 10, the rotation of the magnet through a complete cycle will have generated one bit in the counting stream in the fifth register. Any suitable electronic circuitry for remote readout of the shift register may then be used. Such readout may, for example, be implemented in conjunction with the coaxial cable line of a subscriber television system.

Where the event to be counted is a reciprocating motion rather than a rotating motion, the platelet may be spring mounted within the aperture of an aperture field permanent magnet which is mounted to reciprocate with the mechanism generating the events to be counted. The effect of inertia on the spring mounted platelet results in relative motion between the permanent magnetic frame and the platelet supported therein each time a reciprocating event occurs. Any suitable means for reading the count thus accumulated in such a register may be used. For example, simple optical readout of the position of a single domain in a predetermined channel array may be used where it is intended that the counter be disposable after a single predetermined period of use. Alternatively, electronic readout means such as described may be used if desired.

BRIEF DESCRIPTION OF THE DRAWINGS

These and other features and advantages of the invention will be more readily understood from a detailed description below taken in conjunction with the accompanying drawings in which like reference characters refer to like parts throughout and wherein:

FIG. 3a is a sectional view of the assembled counter module.

FIG. 5a is an enlarged detail view of an individual segment a of the shift register pattern of FIG. 5.

DETAILED DESCRIPTION OF THE DRAWING

Figure 1:
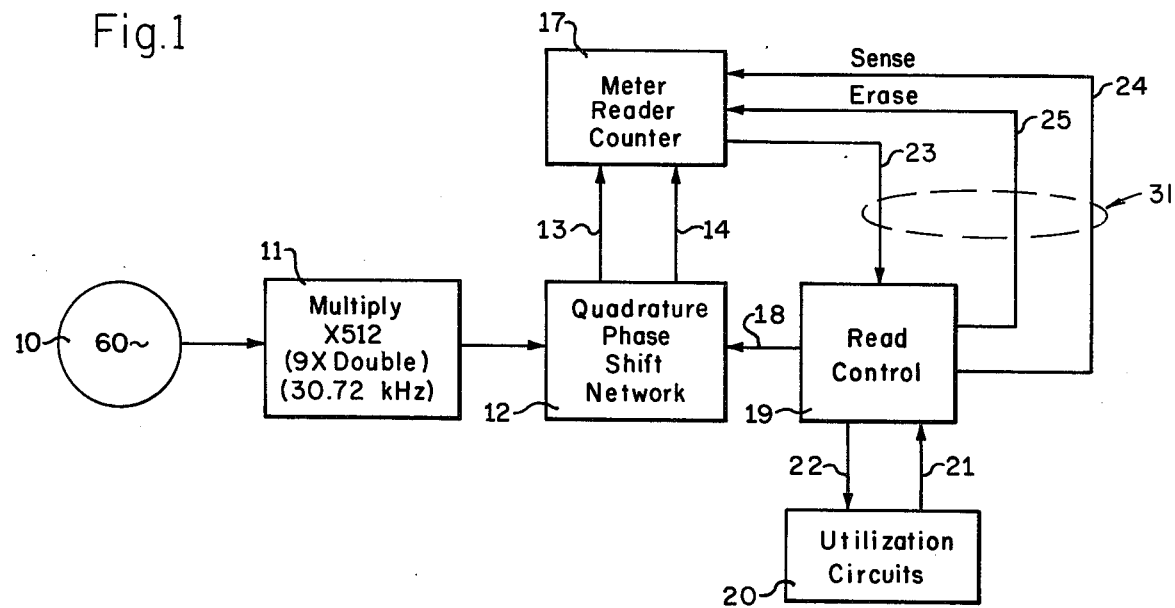
FIG. 1 is a block diagram of a system for remote reading of a utility meter.

Feasibility and economic justification for remote reading of utility meters and the like have been demonstrated by several investigators and both electronic and optomechanical encoders for remote interrogation via either telephone lines or coaxial cable subscriber television services with two-way message capability are now in various stages of developement. The requirements for a practical meter reading encoder are, however, quite stringent and demanding. The cost per encoder must be less than two dollars. The torque for each encoder must be less than one millimeter-gram. The lifetime of each encoder must be more than twenty-five (25) years. The encoder must not be subject to mechanical wear and be temperature insensitive. The encoder must be attachable to present meter registers with only minor modification thereof. The encoder must be capable of being interrogated at random intervals ranging from hours to months. It must provide independent, nonvolatile accumulation and storage of encoded data for such periods and should not interfere with the legibility of the mechanical register. It should consume no power during the register reading and data accumulation and should consume minimal power during interrogation. The technique should be ultimately convertible to direct meterless integration of electrical power and remote interrogation of the accumulated data and it should also be applicable not only to the metering of electrical power but also to other metered utility consumables such as water and gas.

These attributes are achieved in accordance with the present invention by the use of a magnetocrystalline platelet shift register similar to that described in an article published at page 78 of the June 1971 issue of "Scientific America" Magazine written by Bobeck et al and entitled "Magnetic Bubbles", the particular pattern shown on page 80 being preferred for the utility meter. However, in accordance with this invention the counter is provided not with the electronic pulse input drive shown therein but rather than a mechanically actuated magnetic input drive as disclosed in detail below. This is accomplished by connecting the units pointer shaft of a standard utility meter register to means for rotating a permanent magnetic structure which will provide a movable domain nucleation and propagation field to propagate a bit stream in the serial shift register on the platelet to accumulate digital data representative of the number of rotations of the meter shaft. The rotating field acts in conjunction with suitable Y T, or chevron bar patterns on the platelet to nucleate and propagate bubbles along the register track. With each rotation of the pointer shaft and its attached magnet, a bubble is generated at a bubble generating site in the platelet register. Subsequent rotation nucleates a new bubble and indexes the previously generated bubble forward by one step in the register.

Readout from the device is provided by a twophase, rotating field generated by two orthogonal coils surrounding the platelet which are supplied with alternating currents in phase quadrature with each other. The sense of rotation of this field is preferably opposite to the sense of rotation of the pointer shaft magnet. The rate of rotation of the readout field is of course extremely high by comparison to the rate of rotation of the meter driven magnet. To interrogate the accumulated bubbles in the platelet shift register, these field coils are energized and the accumulated bubble bits are extracted in reverse from the register. A suitably placed sensor detects the passing bubbles and produces an electronic pulse train the length of which is proportional to the integrated quantity measured.

Since each bubble is generated by a complete rotation of the decimal base units counter of the meter, each bubble represents a count of 10 in the chosen units of the meter. In a 4 or 5 digit decimal base mechanical meter, however, this degree of resolution or accuracy is sufficient for all practical purposes. That is to say, in a meter originally designed to read up to ten thousand kilowatt hous, an unambiguous readout to an accuracy of pluse or minus 10 kilowatt hours is sufficient for commerical purposes. This is provided by the device disclosed herein which counts each rotation of the meter for the least digit as a single event rather than as a measurement of the number base which is its original meaning.

In FIG. 1 there is shown a block diagram of a remotely controlled utility meter reading system. A source 10 of 60 cycle power at each meter location supplies current to a frequency multiplying circuit 11 which is a part of the circuitry necessary to derive the above mentioned high frequency readout field. The circuit may, for example, consist of nine frequency doublers connected in series so that the 60 cycle power frequency is multiplied by 512 to produce an output from cicruit 11 having a frequency of 30.72 KHz. This output is supplied to a quadrature phase shifting network 12 which transmits one output over line 13 which is in phase with the output of circuit 11 and a second output over line 14 which has been phase shifted by 90°. The outputs from lines 13 and 14 are connected to the field coils 15 and 16 respectively associated with the meter reader counter 17 as seen more particularly in FIG. 2. The outputs from the phase shift network 12 are supplied through conventional gate circuitry under the control of a signal applied over line 18 from the read control circuit 19.

Read control 19 utilizes conventional logic circuitry controlled by commands from the centrally or remotely located utilization circuit 20. Commands to the read control circuit 19 may, for example, be transmitted over a conductor 21 and information from particular meter addressed may be returned to the utilization circuitry over a conductor 22. Of course, time multiplexing of a single channel may be used if desired. When it is desired to read a particular meter the associated read control circuit 19 is addressed by the utilization circuit 20. When communication is thereby established a signal supplied over line 21 opens gate circuits in network 12 on commands from read control circuitry 19 to apply the readout field over conductors 13 and 14 to the meter reader counter 17. Output from meter reader 17 is supplied over line 23 to be transmitted through the read control circuit 19 back over conductor 22 to the utilization circuit. Simultaneously with the read command which opens the gates in network 12, a signal is also supplied over line 24 to activate sensing circuitry in the counter 17 until such time as verification of a correct readout has been achieved at which time a signal supplied over erase line 25 is used to eradicate the count previously accumulated in the counter so that it may begin accumulation of data in the manner described above.

Figure 2:
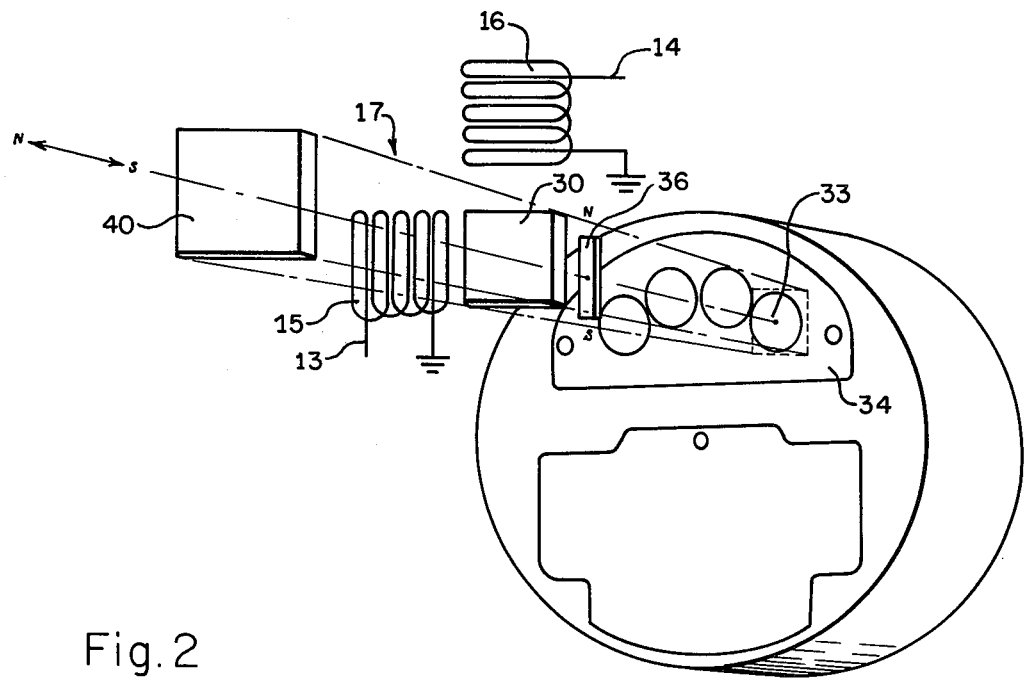
FIG. 2 is an exploded perspective view showing diagrammatically the manner in which the meter reader counter of FIG. 1 is assembled to a conventional utility meter.
Figure 3:
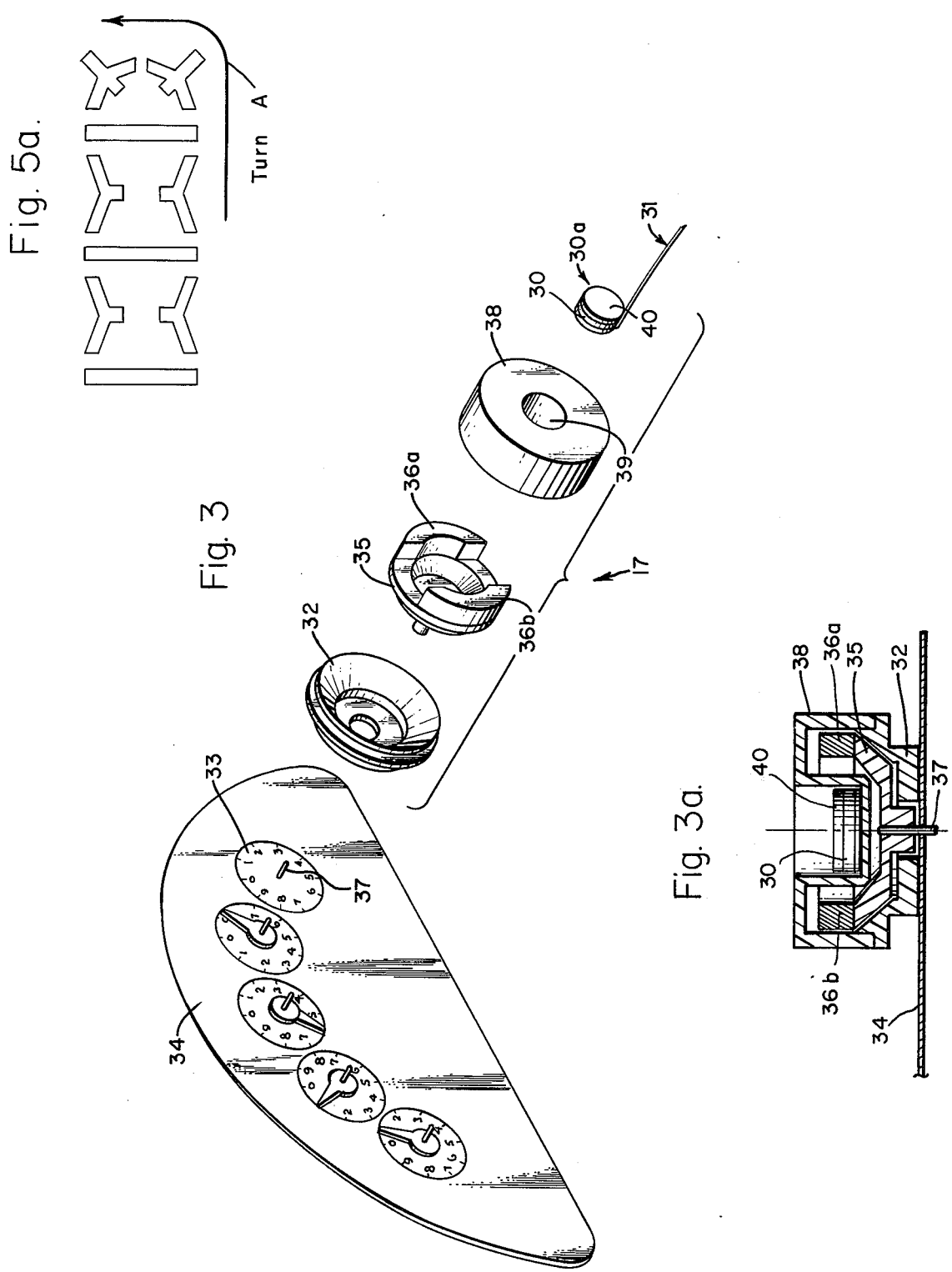
FIG. 3 is an exploded perspective view illustrating the structural details of the counter shown in FIG. 2.

Turning now to FIGS. 2 and 3 the mechanical configuration of the counter will be seen to comprise a magnetocrystalline platelet 30 on which a shift register pattern of Y bars, T bars or chevrons is formed in a manner well known in the art. The platelet 30 has bias magnet 40 juxtaposed thereto and a multiconductor strand 31 for bringing out electrical connections is attached to it as best seen in FIG. 3. The sandwich 30a thus formed is dimensioned and adapted to be received in the central aperture of an assembly comprising a capsule base 32 which is cemented to the base plate of the unit dial 33 of meter 34 after the units pointer has been removed. Rotor 35 is then rotatably supported within the central annular aperture of base member 32 and is rigidly attached to the drive shaft of the units pointer so that the rotor 35 is driven in rotation by the drive shaft 37. In FIG. 2 the magnet 36 diagrammatically represents the magnetic means for generating a rotating field responsively to rotation of the interrogation field.

In FIG. 3 it is seen that in one preferred embodiment the read in or data accumulating rotating magnet is provided by the circular horseshoe magnet assembled from pole pieces 36a and 36b attached to the rotor 35 to rotate with it and thereby provide the necessary counting field. First the transparent base 32 is cemented to the register face to hold the rotor assembly in position. Next rotor 35 is attached to the units pointer shaft. Next transparent cover 38 is placed over base member 32 enclosing rotor 35. Finally the uniaxial platelet and driving circuit sandwich 30 is installed in the central recess or aperture 39 of the cover member 38. Base member 32, rotor 35, and cover 38 are conveniently formed of transparent rigid plastic materials. The transparency of the cover member allows the angular position of the rotor to be read by noting the angular position of the pole pieces 36a and 36b with respect to the face of the meter thereby giving unobstructed "units" visual readout.

The permanent fixed bias magnet 40 seen in FIG. 2 is integral with platelet 30 thus forming a sandwich 30a which is positioned in recess 39. The field coils 15 and 16 shown in FIG. 2 are conveniently wound around the side of the cyclindrically shaped cap member 38.

The central aperture 39 of cap member 38 is formed by a central well in the otherwise hollow cap member and has a closed bottom surface which supports the sandwich 30a. This central well or aperture 39 is positioned in assembled form between the pole pieces 36a and 36b of rotor 35 which in turn is mounted for rotation in the base member 32. Since the cap 38 integrally supports the shift register sandwich 30a and the field coils 15 and 16 which are wound around it, the cap 38 may be removed as a unitary assembly from the base 32 and rotor 35 if it is desired. The plastic rotor member 35 which has the barrium ferrite magnetic pole pieces 36a and 36b attached thereto is driven in rotation by the pointer shaft 37 of the meter so that the field of pole pieces 36a and 36b rotates with respect to the fixed platelet sandwich 30a in the central aperture well 39 of cap 38. This rotation establishes a rotating in plane magnetic field in the plane of platelet 30.

Figure 4:
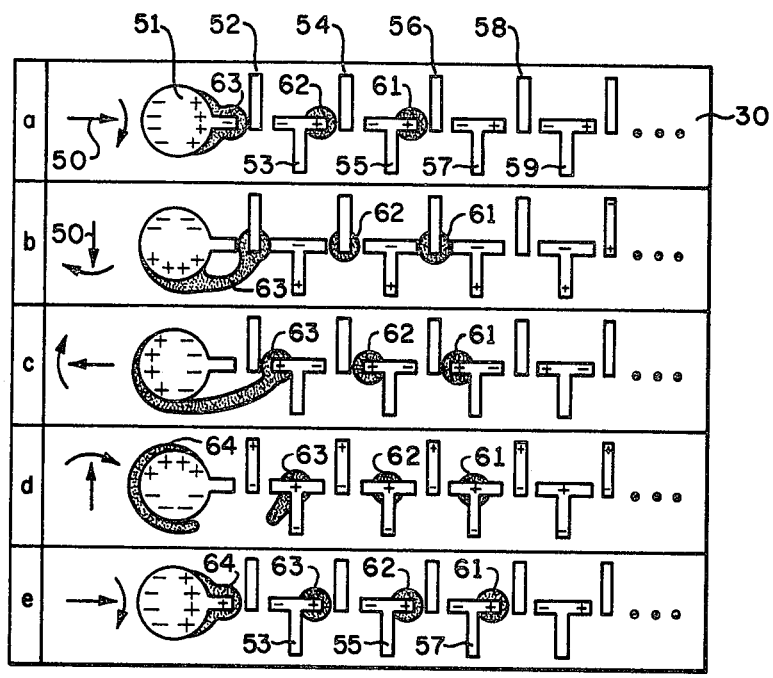
FIG. 4 is a diagrammatic view illustrating the mode of operation of the counter shown in FIG. 2.
Figure 5:
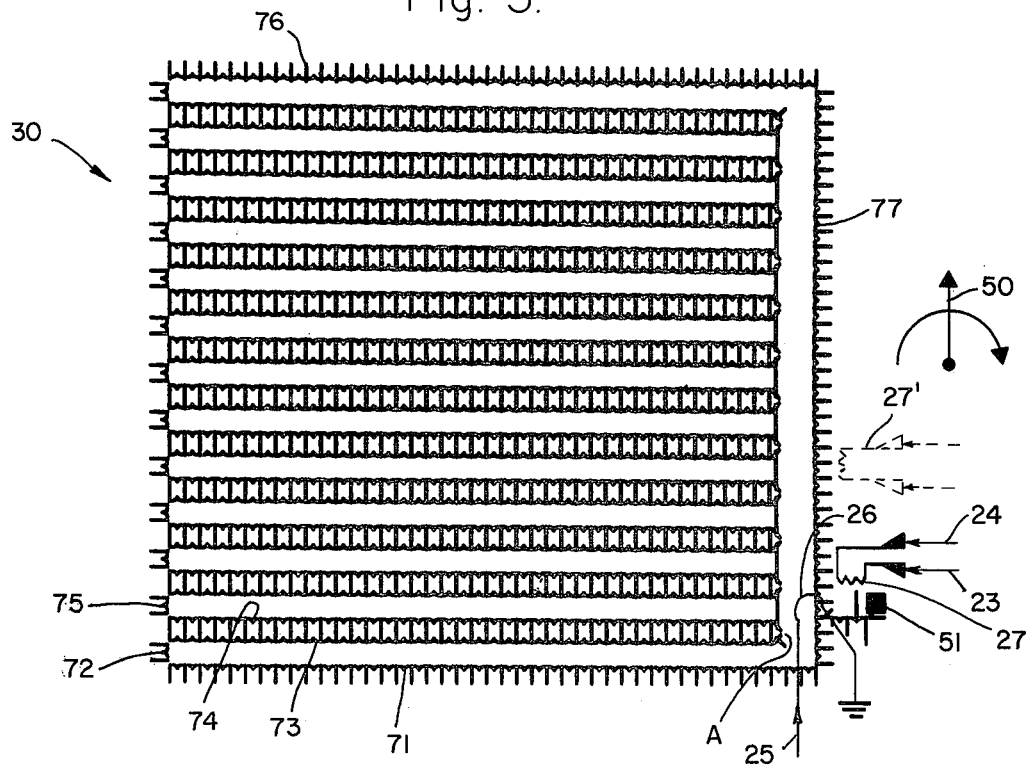
FIG. 5 is a detailed planned view of the circuitry of the shift register counter shown in FIG. 2.

The effect of a rotating in-plane field is shown diagrammatically in FIG. 4. This mode of operation is entirely similar to that described in the cited Bobeck article. In FIG. 4 there is shown a T-bar pattern on a shift register channel, the pattern comprising a bubble generator 51, vetical bars 52, 54, 56 and 58, and T bars 53, 55, 57, and 59. The vertical bars are interspersed between the series of T bars and all of the pattern elements are juxtaposed to the surface of a magnetocrystalline platelet 30 which is preferably garnet or orthoferrite. The T bar pattern will be used to illustrate a principle of operation which is the same for either T bar, Y bar, or chevron patterns having the rotating in plane field drive in common. Although FIG. 5 shows the Y bar as a preferred embodiment, its only advantage is a higher packing density and either pattern may be used.

In FIG. 4a the direction of the rotating magnetic field in the plane of the platelet 30 is indicated by arrow 50 to be such that the Y component of the field is 0 and the X component of the field lies along the positive X axis. FIGS. 4b, 4c, 4d, and 4e are duplicates of FIG. 4a and illustrate the effect of a 90° clockwise rotation of the field indicated by arrow 50 in each of the sequential views. Thus, in FIG. 4b the rotating field indicated by the arrow 50 as turned 90° clockwise from its position in FIG. 4a so that the X component of the field is 0 and the Y component field is directed along the negative Y axis. The cycle is completed in the position shown in FIG. 4e wherein the field of direction has returned to its starting position as shown in FIG. 4a.

The effect of this field rotation on the movable magnetic domains in the platelet 30 is illustrated by the shaded areas 61, 62, and 63, which are the three movable magnetic domains assumed to be existing in the platelet at the start of the process. It will be noted that in this configuration the bubble generator 51 is generally circular in plan view and has a horizontal bar integrally projecting therefrom which is aligned with horizontal portions of the T bar patterns. This projection distorts the movable magnetic domain formed under the circular portion of bubble generator 51 so that the domain assumes the outline shown at 63 in FIG. 4a. Domains 61 and 62 are bubbles which have been generated in previous cycles of operation and have been indexed to holding positions respectively at the ends of T bars 55 and 53 as shown in FIG. 4a in a manner which is illustrated by the sequence of events depicted in FIG. 4b through 4e.

As the field rotates 90° to the position shown in FIG. 4b domain 61 is moved from T bar 55 to vertical bar 56, domain 62 is moved from T bar 53 to vertical bar 54, and domain 63 is distorted from the position shown in FIG. 4a to that shown in FIG. 4b wherein its outermost extremity to the right is latched to the vertical bar 52. This action results from magnetic forces which are well known in the art and are described in greater detail in the references cited above.

The rotation of the field through another 90° to the position shown in FIG. 4c moves the bubble 61 from vertical bar 54 to the left end of T bar 57 and results in corresponding movements in domain 62 and 63 as shown. In the next 90° rotation to the position shown in FIG. 4d the bubble 61 is moved to the central position in T bar 57 and bubbles 62 and 63 are correspondingly moved to the position shown for them. Motion of the bubble 63 to the central position of the first T bar 53 splits this domain and leaves a portion of it under the bubble generator 51. This portion, 64, at this point forms the next bubble to be generated. In FIG. 4e it is seen that this portion 64 now again assumes the shape that portion 63 had in FIG. 4a. Meanwhile throughout the single cycle of rotation of the field the bubble 61 has been moved from the right extremity of T bar 55 to the right extremity of T bar 57 thereby indexing a single unit or bit count into the shift register while generating a new input domain. That is to say, in the configuration shown in FIG. 4a the bubble 61 and 62 read a count of two in the register whereas after the complete single cycle of rotation of the field indicated by arrow 50 the bubbles 61, 62, and 63 as shown in the configuration of FIG. 4e read a count of three in the register. This process is repeated for each rotation of the field indicated by arrow 50.

In FIG. 5 there is shown a plan view diagram of a 1,000 bit shift register using the principles illustrated in FIG. 4 but employing a pattern of alternate bars and Y's rather than bars and T's; the mode of operation is identical. FIG. 5a illustrates in detail one segment of this pattern.

In FIG. 5 there is shown one preferred shift register pattern to accomodate 1,000 bits of information in the register in a manner analogous to that discussed in principle in connection with FIG. 4. As noted, the Y and bar patterns shown in FIG. 5 operate in an identically analogous manner to the T and bar patterns illustrated for convience in FIG. 4. In FIG. 5 the field generated by magnetic pole pieces 36a and 36b shown in FIG. 3 is indicated by arrow 50 which rotates in the clockwise direction when members 36a and 36b are so driven by pointer shaft 37. Bubble generator 51 will generate a new bubble for each complete rotation in the manner discussed in connection with FIG. 4. While this slowly rotating field of the read in mode is accumulating data, the power inputs to meter reader 17 over line 13 and 14 for application to coils 15 and 16 to generate the readout field remain unenergized. The current supply over the sensing input 24 and output 23 and the erase input 25 also remain unenergized. Hence in the data accumulation mode the bubbles resulting from the rotation of permanent magnet pole pieces 36a–b producing field 50 follow only the path determined by the slow rotation of that field acting upon the pattern and no auxiliary power is then required. As shown in FIG. 5 a bubble generated in generator 51 will move horizontally to the left past the sensing magnetoresistor 27 which is now inactive since it is not being supplied with current and past the erase loop 26 which is also inactive since it too is not being supplied with current at this time. At the junction controlled during readout by the erase loop 26 the bubble makes a left turn to go vertically down the portion 70 of the shift register path. At the bottom of this portion it turns right as seen from the point of view of its direction of travel and goes along the bottom horizontal run 71. It then makes a U-turn at the vertical portion 72 at the left of the pattern and comes back across the second horizontal run 73. The bubble then makes another U-turn at the right hand end of run 73 and comes back across run 74 to make another U-turn at the end pattern 75. This meandering path is repeated until the bubble comes across the top run 76 of the register and makes a right turn to come down the right hand side 77.

Of course it is intended that a high frequency readout field rotating in a direction opposite to that of the slow read in field will be used to withdraw the bubbles in a reverse direction along the same path for readout before the full 1,000 bit count of the register has been reached. Should this not occur, however, the bubble coming down path 77 simply tries to repeat its motion along the endless path which now becomes filled with 1,000 bubbles in all possible positions and hence is "jammed" so that no further reading is possible. However, this same phenomenon occurs in mechanically operated meters having a capacity of 10,000 units when all 4 dials have reached 9.

As noted above, in the readin mode each slow rotation of the field of the magnet pole pieces 36a–b generates one new bubble at the bubble generating site 51 in the platelet register 30 of meter reader 17. Each subsequent rotation nucleates a new bubble and indexes the previously generated bubble by one step. The 1,000 bit shift register platelet shown can store a reading of up to 10,000 kilowatt hours of the conventional meter since each revolution of the lowest register digit point and its attached magnet represents 10 kilowatt hours. Furthermore the dimensions of this platelet can be chosen to fit in circular recess 39 FIG. 3 and are compatible with sizes of existing utility meters if garnet is used. Orthoferrites give a higher signal level but afford less packing density.

When it is desired to read out the accumulated count from the register a 2 phase rotating field is generated by the 2 orthogonal coils 15 and 16 which are wound to surround the platelet by applying power to them over conductors 13 and 14 through gates controlled by a signal applied to conductor 18 from the read control device 19 which has been interrogated. In the preferred embodiment the sense of rotation of this readout field is opposite to the sense of rotation of the field of the magnet field which has been represented by arrow 50 in FIG. 5. Thus, in FIG. 5 the readout field in the preferred embodiment would rotate in a counter clockwise direction rather than in a clockwise direction. When the read signal is applied over conductor 18 to start this field, a sense current is simultaneously applied over conductor 24 which current flows through magnetoresistor 27 and back out conductor 23.

The high frequency rotating readout field causes the bubbles to move in the reverse direction from that described above for the read in sequence. That is to say any bubbles which have reached the top run 76 will meander back through the path making the U-turn at member 72 and coming across the bottom run 71 and then starting up the portion 70 of the register track. Under the influence of this high frequency rotating readout field which is sufficiently strong to mask the slowly moving field of the read in magnet, the bubble would normally tend to continue on up the portion 70 into the run 77 of the register. The erase loop 26 supplied with an erase current of suitable polarity over lead in 25 prevents this from happening by establishing a field which causes the bubble when it enters run 70 to turn right and go back past the sensing magnetoresistor 27 to the bubble generator 51 which now swallows the incoming bubble and merges it with the domain normally present under it. Each passage past the magneto resistor 27 of a bubble on its way to oblivion generates a voltage pulse in the circuit 23, 24 since the passage of the bubble changes the resistance value of the magnetoresistor 27. Conventional counting circuits in the utilization circuitry 20 are then able to detect the count which had been stored in the platelet 30. Of course the rate of interrogation is determined by the rotational rate or frequency of the two phase field generated by the orthogonal readout coils.

The readout configuration described above is the one of several possible alternatives. If it is desired to obtain redundant readout to assure accuracy, the sensor resistor 27 can be placed in the run 77 of the shift register (as shown at 27') rather than adjacent to the bubble generator 51. The erase loop 26 is then inactivated to ensure that during the reverse field readout operation the bubbles do not return to bubble generator 51 which during the last readout sequence acts as a bubble swallower. Rather, they are repeatedly cycled past the sensing magnetoresistor 27' which is now in run 77 until two or more consecutive identical readout counts confirm a correct reading. When such a correct reading has been confirmed, the loop 26 is energized so that the bubbles under the influence of its field and of the powerful high frequency readout field will be returned to bubble generator 51 for destruction so that the shift register content is again zero.

A similar redundant readout can be achieved by phasing the high frequency readout field to have the same sense of rotation as the low frequency read in field. In this configuration also the magnetoresistive sensor 27 is placed in the portion 77 of the register, the high frequency field then merely acting to recirculate the existing bubbles past the sensor 27 until a correct count is indicated. In this configuration an additional "inhibit-creation" conductor loop must be provided at the bubble generator 51 so that no bubbles are unintentionally generated during the forward interrogation. Also, the positioning and polarity of the loop 26 must be such that when it is energized after a correct readout has been verified by two or more identical figures, it serves to turn the bubbles from the run 77 to make a right turn to an alternate bubble swallower (not shown) and destruction or erase rather than to be repetitively circulated through the register.

While the mechanically actuated magnetocrystalline counter has been discussed above in connection with one particular application where a rotating cyclic motion is sensed and counted, which, in this case, is the rotation of a meter pointer shaft, it will of course be understood that the counter can be adapted to count any series of cyclic mechanical motions whether they be rotational or reciprocating. Typical instances of reciprocating motions can involve the opening and closing of a valve, and up and down motion of a pump, or the recoil motion of weapons which have been fired. In many such applications a disposable counter intended for onetime use before it is optically read and discarded is sufficient. Such a counter is shown in FIGS. 6 and 7.

Figure 7:
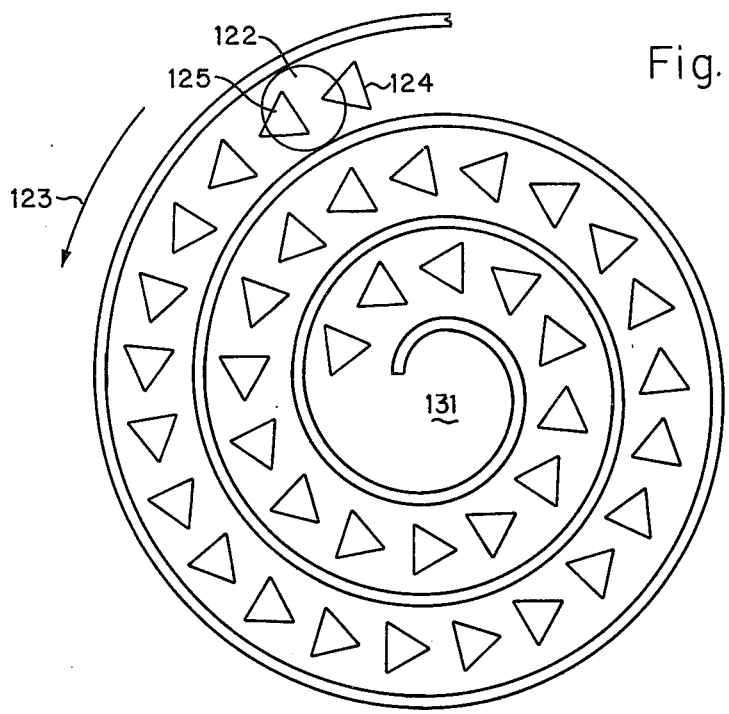
FIG. 7 is a planned view of a shift register configuration suitable for use in the device of FIG. 6.

In FIG. 7 the propagation track which forms the shift register counter element is shown as comprising a spiral series of "angel fish" patterns which are deposited on a magnetocrystalline platelet of the type discussed above. This pattern requires an amplitude modulated bubble driving field orthogonal to the plane of the platelet rather than a rotating in-plane field required by Y-bar or T-bar patterns. In the simplest version of this counter a single bubble domain 122 is provided at the terminus of the spiral track during manufacture of the device. This bubble in operation is propagated along the spiral until it finally stalls at the center indicating maximum count for which the device was constructed.

The bubble domain 122 will propagate inwardly in the direction indicated by the arrow 123 by one step during each cycle of increase and decrease of the bias magnet field flux applied through the platelet for reasons which, as noted above, have been set forth in U.S. Pat. No. 3,540,019. A convenient means of obtaining such a cyclic variation of biased flux is disclosed herein utilizing dual opposed ring magnets as disposed and claimed in my prior U.S. Pat. No. 3,831,156. As described in the cited patents, this propagation of the domain is caused by the weak attraction for the bubble from the tip of the angel fish triangular shaped pole pattern 124 and the strong attraction from the broader back of the next following triangular pole pattern 125.

Figure 6:
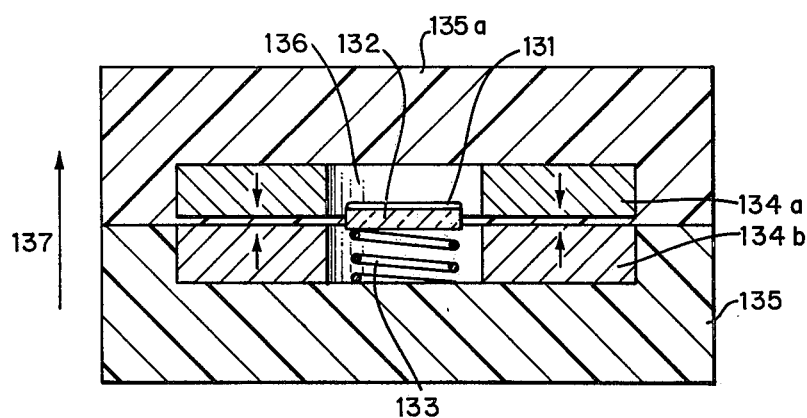
FIG. 6 is a sectional view illustrating a second embodiment of the counter intended to count reciprocating rather than rotating mechanical events.
Figure 8:
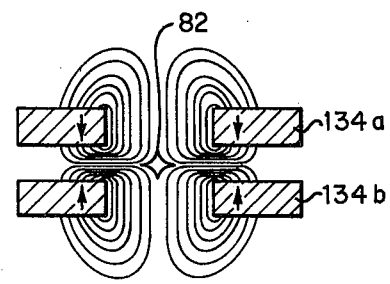
FIG. 8 is a diagrammatic view illustrating the magnetic field pattern of the opposed ring magnets shown in FIG. 6.

FIG. 6 is a cross-sectional view of one possible embodiment of a counter utilizing this concept in which the magnetic bubble propagation cycle is generated internally by purely mechanical motion. The uniaxially anisotropic crystal platelet 131 with the spiral angel fish pattern thereon is mounted on a transparent supporting mass 132 such as a glass plate which in turn is supported by a miniature spring 133. Surrounding this assembly is a pair of ring magnets 134a and 134b respectively of opposing polarity. The resulting field pattern of this pair of ring magnets is illustrated in FIG. 8 and will be seen to have a central region 82 of zero field with gradients of opposing polarity on opposite sides. Encapsulating the device is a transparent plastic or glass body 135 which positions the magnets 134a and b with respect to the spring mounted platelet 134 and which supports the spring 133.

A displacement transient applied to the counter in the direction of the arrow 137 will move the angel fish pattern platelet 131 and mass 132 downward and back resulting in a change of bias flux for the platelet and digital count. This change of flux results from the fact that as shown in my U.S. Pat. No. 3,831,156 the opposing polarities of the ring magnets 134a and 134b create a region of zero field at their interface and field regions in their apertures which are oppositely directed. Thus, as the platelet descends the field will become zero and then increases in the opposite direction. As the spring returns the platelet to the position shown the field will of course return to its initial value. If a particular application requires that critical damping be provided in order to avoid more than one oscillation per transient, such critical damping can be achieved by filling the interior volume 136 with a suitable damping medium such as a transparent oil.

Assuming a total count capacity of 10,000 bits it is possible to accommodate the entire counter assembly in a cylindrical volume of less than one inch in diameter and less than half an inch in height. In use the counter capsule is attached to the apparatus on which reciprocating mechanical events are to be cumulatively counted. In this simplest version the count readout may be in the manner of a radiation dosimeter. To read out the accumulated count, the capsule is removed from the event producing apparatus and inserted into a portable polarizing microscope for detection of the bubble location by observation through window 135a in transparent enclosure 135. Marks in the eyepiece of the microscope will aid in this readout.

If electronic readout is desired in the device of FIG. 6, then a magnetoresistive sensor is applied to the innermost end of the spiral angel fish track. Since bubble propagation is unidirectional only the accumulated count is derived from the number of cycles remaining to bring the bubble to its terminus where the sensor is located. During readout this sensor is connected to a current supply and counted through a jack and plug (not shown) and the device is artificially reciprocated by any convenient means through a known or counted number of cycles.

It is thus seen that the mechanically actuated magnetocrystalline counter may be used for counting a series of cyclic mechanical events whether they are of a reciprocating or rotating nature.

I claim:

1. A mechanically actuated magnetocrystalline counter for counting a series of mechanical events, said counter comprising:
   a. a uniaxially anisotropic magnetocrystalline platelet having means associated therewith for sustaining at least one movable cylindrical magnetic domain therein and means for guiding said domain to move sequentially through a predetermined shift register pattern of positions therein;
   b. permanent magnet means mounted to be moved relatively to said platelet responsively to a mechanical event comprising a pair of apertured magnets mounted adjacent to each other in opposed polarity relationship with the apertures thereof aligned to form a central chamber in which said uniaxially anisotropic magnetocrystalline platelet is spring mounted for movement in and orthogonally to the central field of said apertured magnets responsively to a mechanical transient applied thereto by one of said mechanical events to be counted for generating a cyclically moving magnetic field for moving said at least one movable magnetic domain through said serial shift register formed in said platelet to form a bit stream which digitally accumulates data representative of said series of mechanical events, each cycle of said field motion resulting from one of said mechanical events and each said cycle of said field motion producing a single bit in said bit stream; and,
   c. means to read out the count thereby accumulated in said shift register.

2. A mechanically actuated magnetocrystalline counter for counting a series of mechanical events as in claim 1 wherein said means to read out the count accumulated in said shift register comprises a transparent means for covering said uniaxially anisotropic magnetocrystalline platelet and for providing a site for observation of the position of magnetic domains therein by optical means.

3. A mechanically actuated magnetocrystalline counter for remote reading of a plural register mechanically driven meter, said counter comprising:
   a. a uniaxially anisotropic magnetocrystalline platelet having means associated therewith for sustaining a plurality of movable cylindrical magnetic domains therein and means for guiding said domains to move sequentially through a predetermined shift register pattern of positions therein;
   b. permanent magnet means mounted to be rotated by the shaft of the least significant digit register of said meter for generating a cyclically moving magnetic field for moving said movable magnetic domains through said serial shift register formed in said platelet to form a bit stream which digitally accumulates data representative of the rotation of said shaft, each cycle of said field motion resulting from one complete 360° rotation of said shaft and each cycle of said motion generating one new domain and indexing all other domains forward one position to produce a single bit in said bit stream, the total bit storage capacity of said platelet being at least equal to the total count capacity of said meter divided by the numerical value of the number base of the registers of said meter; and,
   c. means to read out the count accumulated in said shift register by said bit stream.

4. A mechanically actuated magnetocrystalline counter for counting a series of mechanical events as in claim 2 wherein said permanent magnet means mounted to be moved relatively to said platelet responsively to a mechanical event to be counted comprises at least one permanent magnet mounted on a rotor which in turn is connected to be rotatably driven by a shaft of a mechanical meter, one rotation of said shaft representing a count equal to one event and said rotor being centrally apertured to provide a space for receiving said magnetocrystalline platelet within said aperture, said rotor mounted permanent magnet producing a field which rotates in the major plane of said platelet.

5. A device as in claim 4 wherein
   a. said meter is a utility flow meter; and wherein,
   b. said shaft rotatably driving said rotor is the shaft of the lowest significant digit dial of said meter; and, wherein,
   c. one rotation of said shaft represents a count equal to the number base of the number system in which said meter is calibrated.

6. A mechanically actuated magnetocrystalline counter for counting a series of mechanical events as in claim 2 wherein said means to read out the count accumulated in said shift register comprises:
   a. means to supply current to a normally passive magnetoresistive sensor positioned in the path of flow of said bit stream representing magnetic domain of said serial shift register formed in said platelet;
   b. means to generate a rotating magnetic field for moving said at least one movable magnetic domain of said shift register past said sensing resistor to produce a change in resistance of said magnetoresistor which results in a voltage pulse across said resistor; and,
   c. means utilizing said voltage pulse to determine the position which said movable magnetic domain had reached in said shift register and thereby to read the accumulated count therein.

7. A device as in claim 6 wherein said series of mechanical events to be counted comprises the rotation of the pointer shaft protruding through the dial face of the least significant digit meter of a utility flow meter; wherein said permanent magnet means mounted to be moved relatively to said platelet responsively to said mechanical event to be counted comprises at least one permanent magnet mounted on a rotor which in turn is connected to be rotatably driven by said shaft; and, wherein one rotation of said shaft represents a count numerically equal in the units which the meter measures to the number base of the number system of the meter, said shift register accumulating one bit for each of said rotations and said shift register having a total capacity equal to the total reading capacity of said meter divided by said number base thereof.

8. A device as in claim 2 wherein said means to read out the count accumulated in said shift register comprises:

a. sensor means positioned at a predetermined point in the path of flow of said bit stream representing magnetic domains of said serial shift register formed in said platelet; and, b. means to generate a rotating magnetic field in the plane of said platelet for moving said movable magnetic domains of said shift register past said sensor to produce an output signal to read the accumulated count in said shift register.

9. A device as in claim 2 wherein said means to read the count accumulated in said shift register comprises:

a. remotely controlled means to supply current only during read out to a normally passive magnetoresistor positioned in the path of flow of said bit stream representing magnetic domains of said serial shift register formed in said platelet;

b. means to generate a rotating magnetic field for moving said movable magnetic domains of said shift register past said magnetoresistor to produce changes in its resistance which result in voltage pulses across said resistor; and, c. means utilizing said voltage pulses to produce an output signal to read the count accumulated in said shift register.

10. A device as in claim 9 wherein said platelet contains a plurality of movable magnetic domains, one domain being generated and all other domains being indexed forward one position by each of said events being counted, and wherein the pattern of said shift register includes a continuous loop path through which said domains may be recirculated and a domain generating branch for generating domains and indexing them forward into said continuous loop during counting of said events, and said device further including readout field generating means for moving said domains backward in a direction opposite to that in which they are moved by said counted events and signal controlled means for recirculating said accumulated plurality of domains past said sensor during readout until a redundant readout of at least two counts having the same numerical value is obtained and for thereafter directing said domains into said generating branch thereby resulting in their erasure to reset said counter to zero.

11. A counter as in claim 3, said counter further comprising:

housing means for supporting said platelet and said reading means as a retrofit replacement on the dial face of said least significant digit register of said meter, all other register dial faces being left undisturbed to permit visual reading thereof.

* * * * *